US012660551B2

(12) United States Patent
Lee et al.

(10) Patent No.: US 12,660,551 B2
(45) Date of Patent: Jun. 16, 2026

(54) SEMICONDUCTOR CHIP MOLDING DIE DEVICE

(71) Applicant: Samsung Electronics Co., Ltd., Suwon-si (KR)

(72) Inventors: Hwansoo Lee, Suwon-si (KR); Minsang Park, Suwon-si (KR); Hoon Chang, Suwon-si (KR); Byeonggon Kim, Suwon-si (KR); Sunghwa Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 321 days.

(21) Appl. No.: 18/446,900

(22) Filed: Aug. 9, 2023

(65) Prior Publication Data

US 2024/0006198 A1     Jan. 4, 2024

Related U.S. Application Data

(63) Continuation of application No. PCT/KR2022/002304, filed on Feb. 16, 2022.

(30) Foreign Application Priority Data

Mar. 4, 2021    (KR) ........................ 10-2021-0028989

(51) Int. Cl.
H10P 72/00          (2026.01)
B29C 33/10          (2006.01)
          (Continued)

(52) U.S. Cl.
CPC .......... H10P 72/0441 (2026.01); B29C 33/10 (2013.01); B29C 33/18 (2013.01); B29C 33/68 (2013.01); B29L 2031/3406 (2013.01)

(58) Field of Classification Search
CPC ... H01L 21/67126; B29C 33/10; B29C 33/18; B29C 33/68; H10P 72/0441
See application file for complete search history.

(56) References Cited

U.S. PATENT DOCUMENTS 4,270,906 A * 6/1981 Kraft ..................... F16H 7/1281
                                                    74/567
6,787,093 B2 9/2004 Kiritani
          (Continued)

FOREIGN PATENT DOCUMENTS

JP          3019096 B1      3/2000
JP      2001-168121 A      6/2001
          (Continued)

OTHER PUBLICATIONS

KR20170019323 machine translation (Year: 2014).*
          (Continued)

*Primary Examiner* — Alison L Hindenlang
*Assistant Examiner* — Alexander A Wang
(74) *Attorney, Agent, or Firm* — Jefferson IP Law, LLP

(57)          ABSTRACT

A die device for molding a plurality of semiconductor chips is provided. The die device includes a lower die including a moving plate that has a plurality of V-groove structures for suctioning a release film coated with a resin, and an upper die which descends to the lower die or ascends from the lower die, thereby closing/opening the dies. The upper die includes at least a plurality of suction vent units for suctioning a substrate on which the semiconductor chips are arranged, and the lower die includes a device for manually adjusting the tension of a spring that supports the moving plate.

15 Claims, 13 Drawing Sheets

(51) Int. Cl.
    *B29C 33/18*     (2006.01)
    *B29C 33/68*     (2006.01)
    *B29L 31/34*     (2006.01)

(56)         References Cited

U.S. PATENT DOCUMENTS

| | | | |
|---|---|---|---|
| 6,854,161 B2 | 2/2005 | Lee | |
| 2002/0015748 A1* | 2/2002 | Miyajima | H01L 24/97 |
| | | | 425/127 |
| 2004/0043103 A1* | 3/2004 | Bokich | F16C 33/306 |
| | | | 425/589 |
| 2006/0186576 A1 | 8/2006 | Takase et al. | |
| 2009/0127732 A1 | 5/2009 | Tamura | |

FOREIGN PATENT DOCUMENTS

| | | | |
|---|---|---|---|
| JP | 2004-148621 A | 5/2004 | |
| JP | 2007-190704 A | 8/2007 | |
| JP | 4262468 B2 | 5/2009 | |
| JP | 5786918 B2 | 9/2015 | |
| JP | 6557428 B2 | 8/2019 | |
| KR | 10-0162789 B1 | 5/1999 | |
| KR | 10-2002-0096078 A | 12/2002 | |
| KR | 10-2006-0052812 A | 5/2006 | |
| KR | 10-2010-0000950 A | 1/2010 | |
| KR | 20-2010-0004398 U | 4/2010 | |
| KR | 10-2011-0097403 A | 8/2011 | |
| KR | 10-2011-0099198 A | 9/2011 | |
| KR | 10-2011-0123035 A | 11/2011 | |
| KR | 10-2013-0093532 A | 8/2013 | |
| KR | 10-2017-0019323 A | 2/2017 | |
| KR | 10-2017-0092096 A | 8/2017 | |
| KR | 10-1813391 B1 | 12/2017 | |
| KR | 10-1838773 B1 | 3/2018 | |
| KR | 10-2019-0020610 A | 3/2019 | |
| KR | 10-2019-0060953 A | 6/2019 | |
| KR | 10-2019-0106759 A | 9/2019 | |
| KR | 10-2037098 B1 | 10/2019 | |
| KR | 10-2020-0026036 A | 3/2020 | |
| KR | 10-2021-0011070 A | 1/2021 | |

OTHER PUBLICATIONS

KR20200026036 machine translation (Year: 2020).*
Korean Office Action dated Dec. 16, 2024, issued in Korean Patent Application No. 10-2021-0028989.
Korean Notice of Patent Grant dated Apr. 25, 2025, issued in Korean Patent Application No. 10-2021-0028989.
International Search Report dated Jun. 10, 2022, issued in International Application No. PCT/KR2022/002304.

* cited by examiner

23

22

320

SEMICONDUCTOR CHIP MOLDING DIE DEVICE

CROSS-REFERENCE TO RELATED APPLICATION(S)

This application is a continuation application, claiming priority under § 365 (c), of an International application No. PCT/KR2022/002304, filed on Feb. 16, 2022, which is based on and claims the benefit of a Korean patent application number 10-2021-0028989, filed on Mar. 4, 2021, in the Korean Intellectual Property Office, the disclosure of which is incorporated by reference herein in its entirety.

BACKGROUND

1. Field

The disclosure relates to a molding device for electronic components. More particularly, the disclosure relates to a die device for molding a semiconductor chip.

2. Description of Related Art

A die device for molding electronic components may be a die device for molding electronic components arranged on a substrate with a resin. The die device for molding electronic components may include an upper die and a lower die. The upper die may move up and down, and the lower die may be in a fixed state. When the upper die descends to the lower die and enters a closed die state with the lower die, the electronic components arranged on the substrate may be molded using resin.

After a series of operations of closing a mold by the upper die and lower die described above, the upper die may be moved upwards and then the molded electronic components may be taken out.

The above information is presented as background information only to assist with an understanding of the disclosure. No determination has been made, and no assertion is made, as to whether any of the above might be applicable as prior art with regard to the disclosure.

SUMMARY

However, since there is no separate central guide device on a moving plate disposed on a lower die of a conventional molding die device, eccentricity may occur between a main core and a moving plate, and operation troubles may occur while tilting, thereby causing poor flatness of a product and deterioration of molding quality.

The molding die device uses a release film to facilitate taking out molded electronic components. Folds may occur at the corners of the release film in a case of suctioning on four sides on the moving plate, and when molding, molded electronic components may be crushed, causing appearance defects.

In order to adjust a molding thickness of an electronic component in a molding die device, washers having different thicknesses are replaced and inserted to adjust a compression tension of a spring installed under the moving plate, but it may take a long time for works such as disassembling the die device to insert the washers between the spring and the moving plate.

The molding die device may have problems with stamping (transferring) defects on a substrate due to air suction holes provided in a main core disposed on the upper die when molding a semiconductor chip.

The molding die device is equipped with a clamp to fix the substrate to the upper die of the molding device. Pressing defects of electronic components may occur during molding due to a pressing of the release film by a clamp escape groove of the moving plate.

Aspects of the disclosure are to address at least the above-mentioned problems and/or disadvantages and to provide at least the advantages described below. Accordingly, an aspect of the disclosure is to provide a die device for molding electronic components in which molding thickness difference defects are improved.

Another aspect of the disclosure is to provide a die device for molding electronic components, which has a center guide installed on the moving plate, thereby preventing operation troubles while tilting when the upper/lower die goes up and down.

Another aspect of the disclosure is to provide a die device for molding electronic components in which folding defects at the corners of the release film are improved.

Another aspect of the disclosure is to provide a die device for molding electronic components, which uses a spring tension adjustment unit without disassembling the mold in order to adjust the molding thickness of the electronic component.

Another aspect of the disclosure is to provide a die device for molding electronic components, which uses a vent core without a clamp for fixing a semiconductor substrate.

Additional aspects will be set forth in part in the description which follows and, in part, will be apparent from the description, or may be learned by practice of the presented embodiments.

In accordance with an aspect of the disclosure, a die device for molding a plurality of semiconductor chips is provided. The die device includes a lower die including a moving plate that has a plurality of V-groove structures configured to suction a release film coated with resin, and an upper die configured to descend to the lower die or ascend from the lower die so as to close/open the dies, wherein the upper die includes at least a plurality of suction vent units configured to suction a substrate on which the semiconductor chips are arranged, and wherein the lower die includes a device configured to manually adjust tension of a spring supporting the moving plate.

A die device for molding electronic components according to various embodiments of the disclosure may maintain a constant molding thickness of an electronic component during molding, thereby reducing molding thickness difference defects.

A die device for molding electronic components according to various embodiments of the disclosure may improve the stamping problem on the substrate due to suction holes of the upper die and improve the release film pressing by removing the clamp.

A die device for molding electronic components according to various embodiments of the disclosure may improve suction performance according to an increase in the air suction area by applying a suction vent core structure.

A die device for molding electronic components according to various embodiments of the disclosure may solve the stamping problem or folding problem of the release film.

A die device for molding electronic components according to various embodiments of the disclosure may easily adjust the thickness of a molded product using a spring compression tension adjustment unit without disassembling the mold.

A die device for molding electronic components according to various embodiments of the disclosure may adjust the molding thickness individually by rotating an adjustment cam in multiple steps (e.g., three steps), instead of disassembling the mold, using a cam structure.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
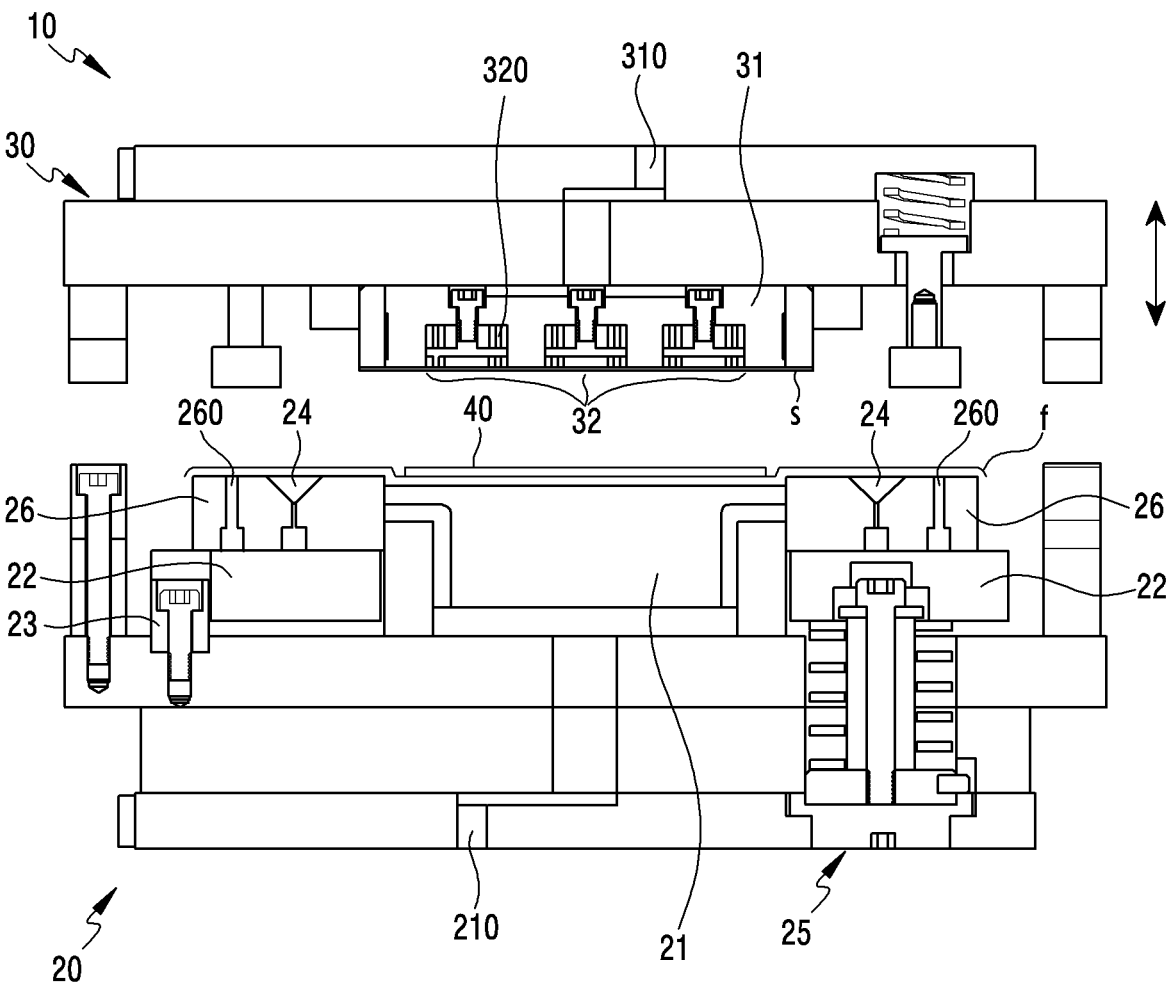
FIG. 1 is a diagram illustrating a die device in a state in which dies are open according to an embodiment of the disclosure.

FIG. 1 is a diagram illustrating a die device in a state in which dies are open according to an embodiment of the disclosure.

Referring to FIG. 1, a die device 10 according to embodiments may be a die device 10 that respectively molds electronic components mounted on a substrate(s), for example, a plurality of arranged semiconductor chips with resin. According to other embodiments, the die device 10 may include a lower die 20 and an upper die 30. The lower die 20 may be fixed, and the upper die 30 may be movably disposed. The upper die 30 may, for example, move up and down above the lower die 20. In an embodiment, the die device 10 may switch to a closed die state by moving the upper die 30 to the lower die 20 and switch from the closed die state to an open die state by moving the upper die 30 upwards. In the closed die state of the die device 10, a molding process of semiconductor chips may be performed.

In another embodiment, molding of a semiconductor chip using the die device 10 may be performed in the following sequence. A substrate(s) on which a plurality of semiconductor chips is arranged may, for example, be suctioned by the upper die 30, and a release film f coated with a resin may be positioned while being suctioned by the lower die 20. Subsequently, after the upper die 30 descends toward the lower die 20 to be in a closed die state, a molding process may be performed, and then a take-out process may follow, thereby completing molding of the plurality of semiconductor chips.

In still another embodiment, the die device 10 for molding a series of a plurality of semiconductor chips may include a lower main core 21, an upper main core 31, a take-out core 26, a moving plate 22, a center guide block 23, a suction vent core 32, a device 25 for adjusting tension of a spring (hereinafter referred to as an "adjustment device"), and a V-groove structure 24 for suctioning.

According to an embodiment, the lower main core 21, the take-out core 26, the center guide block 23, and the adjustment device 25 may be disposed on the lower die 20, and the upper main core 31 and the suction vent core 32 may be disposed on the upper die 30.

According to another embodiment, the lower main core 21 is a central mold block of the lower die 20 and may support the moving plate 22. According to yet another embodiment, the take-out core 26 may be disposed on the lower die 20 and may be a mold block for separating a molded release film f. According to still another embodiment, the take-out core 26 may include a take-out hole 260 for separating the suctioned release film f. A plurality of take-out holes 260 of the take-out core may, for example, be arranged at regular intervals along the edges of the moving plate 22.

According to some embodiments, the center guide block 23 may be a unit for controlling movement of the center of the upper die 30 when the upper die 30 moves up and down. According to other embodiments, the center guide block 23 may be disposed close to the V-groove structure 24 disposed on the moving plate 22.

In one embodiment, the adjustment device 25 may be disposed to interwork with the moving plate 22 disposed on the lower die 20 and may be disposed below the V-groove structure 24.

In another embodiment, the upper main core 31 is a central block of the upper die 30 and may support the suction vent core 32. In yet another embodiment, the suction vent core 32 may include at least one or more suction vent units 320. The suction vent core 32 may, for example, suction a semiconductor chip substrate(s) with a uniform suction force by means of a plurality of suction vent units 320 spatially connected to an air suction hole 310.

According to some embodiments, the V-groove structure 24 may be spatially connected to an air suction hole 210 to provide a uniform suction force to the release film f.

According to other embodiments, the substrate(s) on which molded semiconductor chips are arranged may be moved to another place by a suction pad (not shown), and a new substrate on which unmolded semiconductor chips are arranged may be moved to the die device for molding.

According to one embodiment, the release film f may be moved to another place and discarded after the molding of semiconductor chips is completed using the resin, and a release film coated with a new resin may be moved onto the moving plate 22. In an example, the release film f may be rolled up a roller (not shown) and continuously supplied to the die device.

Figure 2:
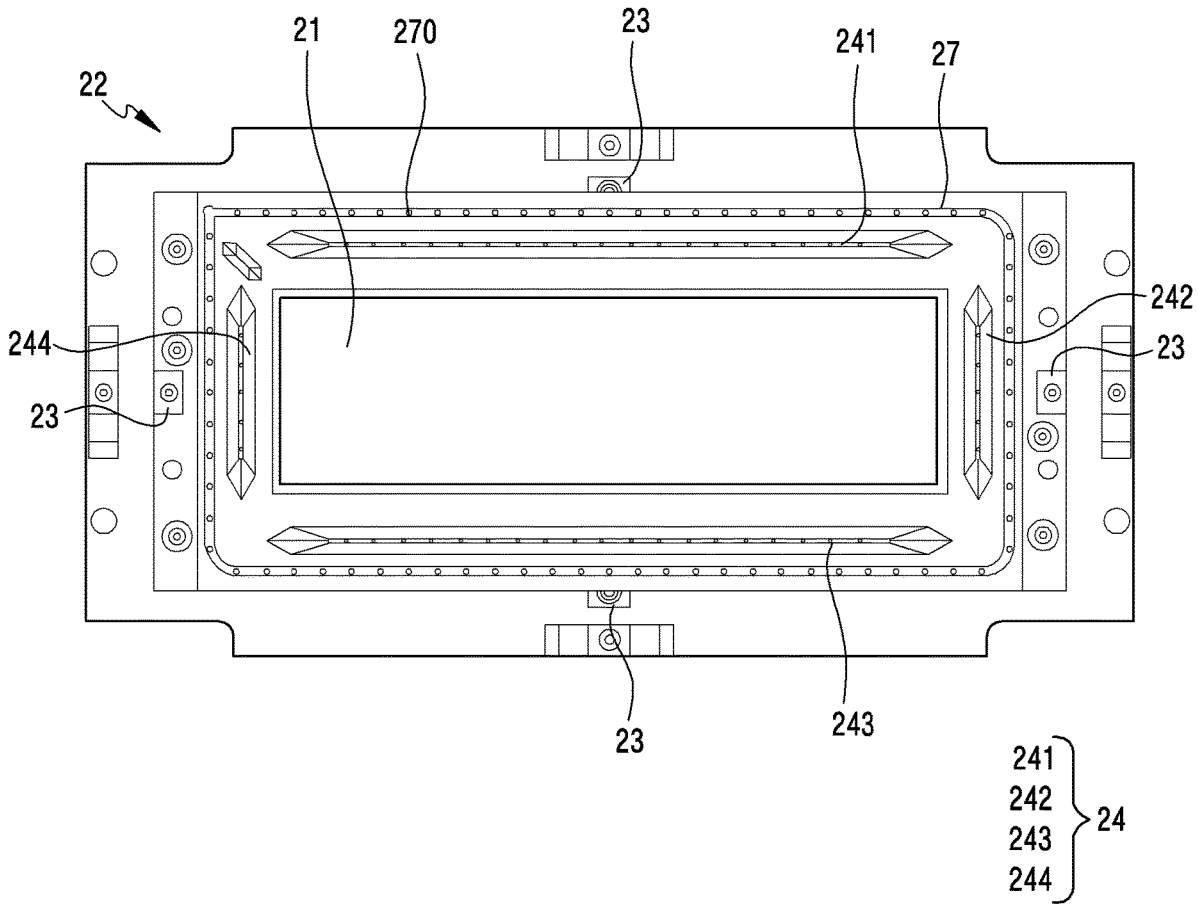
FIG. 2 is a plan view illustrating a moving plate according to an embodiment of the disclosure.
Figure 3A:
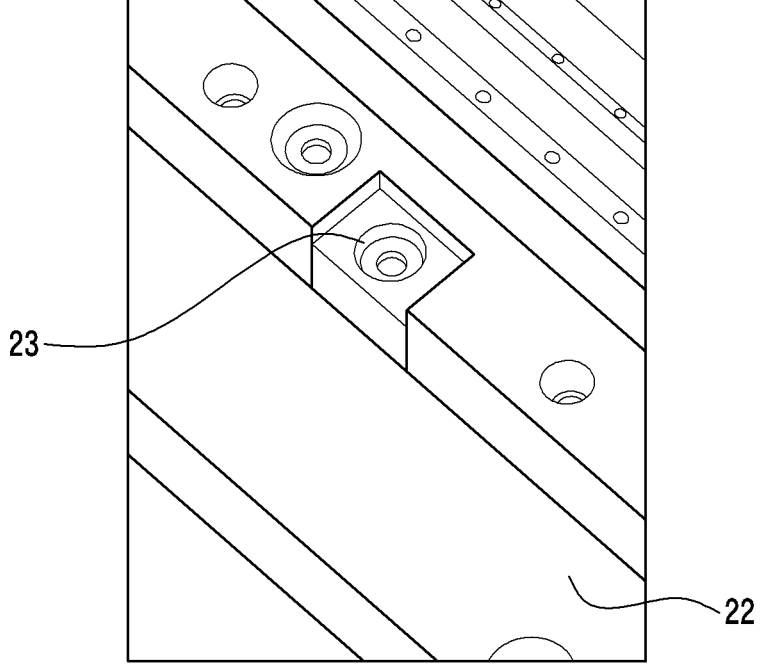
FIGS. 3A and 3B are perspective and cross-sectional views respectively illustrating one center guide block disposed on a moving plate according to various embodiments of the disclosure.
Figure 3B:
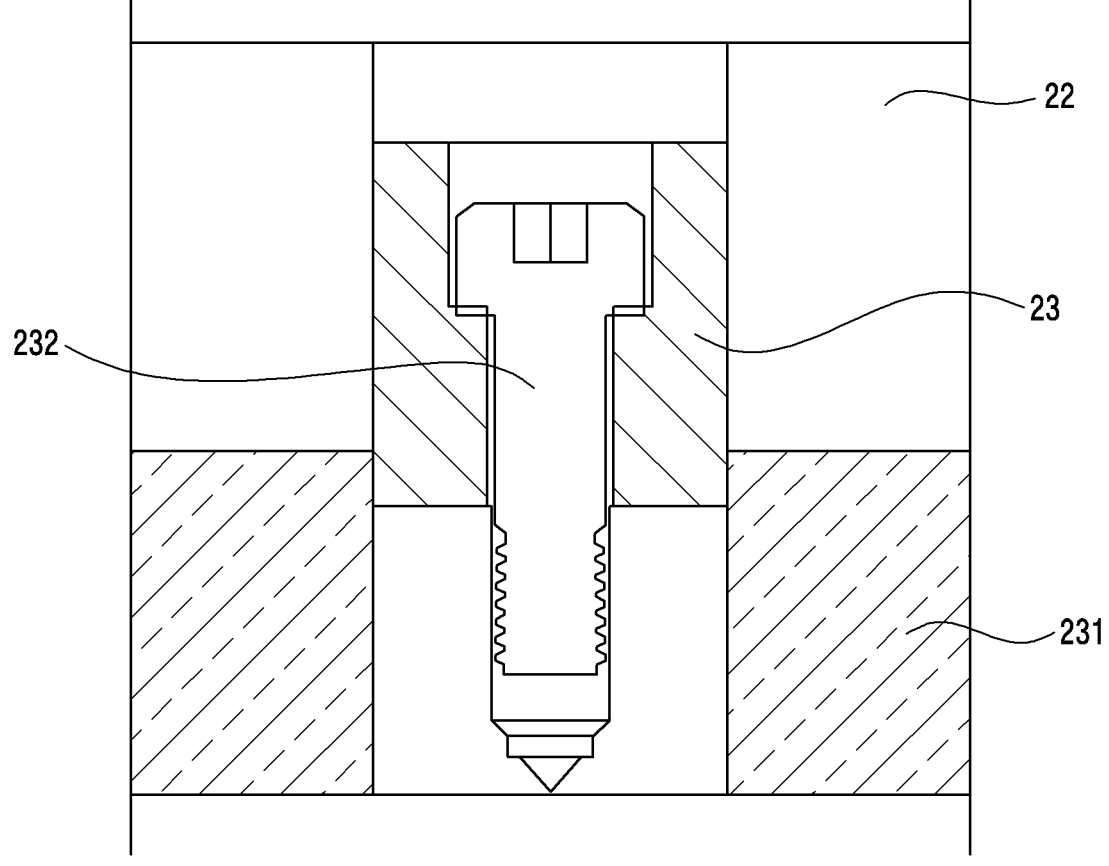

FIG. 2 is a plan view illustrating a moving plate according to an embodiment of the disclosure. FIGS. 3A and 3B are perspective and cross-sectional views respectively illustrating one center guide block disposed on a moving plate according to various embodiments of the disclosure.

Referring to FIGS. 2, 3A, and 3B, according to various embodiments, a moving plate 22 disposed on a lower die 20 may include at least one or more center guide blocks 23 arranged along the periphery of a lower main core 21 disposed in a center thereof. According to other embodiments, at least one or more center guide block 23 may maintain the center of movement of an upper die 30 when the upper die 30 moves up and down and maintain the center of the upper die 30 in the closed die state after the movement. For example, the center guide block 23 may be disposed on the moving plate 22 by fastening a fastener 232 to a fastening hole formed in a supporting plate 231.

In an embodiment, the center guide blocks 23 may include first to fourth center guide blocks 23 disposed on first to fourth edges of the moving plate 22. In an example, the first to fourth center guide blocks 23 may be symmetrically disposed in vertical and horizontal directions.

In another embodiment, a V-groove structure 24 may be formed along the periphery of the lower main core 21 positioned at the center of the moving plate 22. In yet another embodiment, the V-groove structure 24 may be, as a suction groove, a unit that suctions a release film f placed thereon such that the release film f remains in a flat state. In still another embodiment, a plurality of V-groove structures 24 may be formed to tightly pull the release film f. For example, the V-groove structure 24 may include first to fourth V-grooves 241 to 244 so that the first and third V-grooves 241 and 243 face each other and so that the second and fourth V-grooves 242 and 244 face each other. In another example, the first and third V-grooves 241 and 243 may be disposed along the long side of the release plate 22, and the second and fourth V-grooves 242 and 244 may be disposed along the short side of the release plate 22.

The moving plate 22 may have a suction vent portion 27 disposed along the periphery, for example, first to fourth edges, thereof, and a plurality of suction holes 270 may be formed in the suction vent portion 27. According to another embodiment, the plurality of suction holes 270 may be formed along the periphery of the first to fourth V-grooves 241 to 244. For example, the respective suction holes 270 may be formed at regular intervals.

Figure 4:
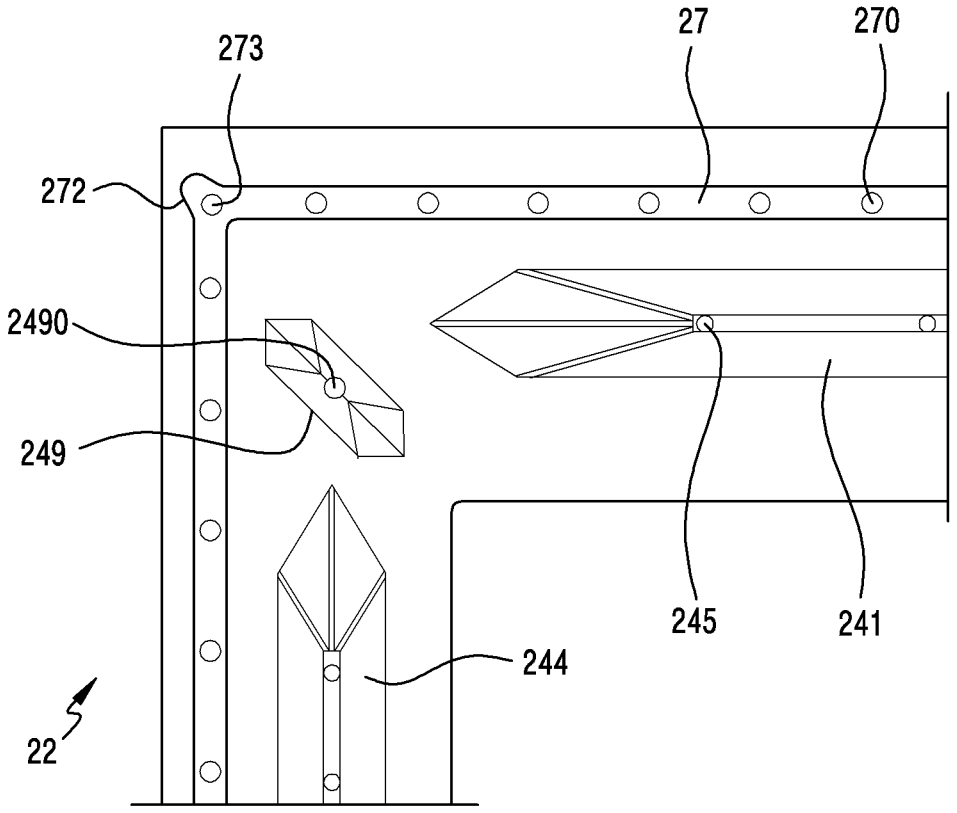
FIG. 4 is a plan view illustrating a supplementary V-groove formed at a corner of a V-groove structure according to an embodiment of the disclosure.

FIG. 4 is a plan view illustrating a supplementary V-groove formed at a corner of a V-groove structure according to an embodiment of the disclosure.

Referring to FIG. 4, according to various embodiments, a V-groove structure 24 may have a supplementary V-groove 249 formed at a corner thereof and formed between a first V-groove 241 and a fourth V-groove 244. In an example, the supplementary V-groove 249 may extend in a direction crossing the area between the first V-groove 241 and the fourth V-groove 244. According to various embodiments, the supplementary V-groove 249 may be formed to prevent folding of the corner portions of the release film f. In another example, the supplementary V-groove 249 is straight and may have at least one additional suction hole 2490 formed therein.

According to some embodiments, the suction vent portion 27 may include a supplementary suction portion 272 protruding outwards at the corner thereof. According to other embodiments, the supplementary suction portion 272 may further include at least one or more supplementary suction holes 273. The supplementary suction portion 272 does not need to be limited to one corner of the suction vent portion (i.e., unit) 27 and may be formed at two or more corners of the same.

Figure 5:
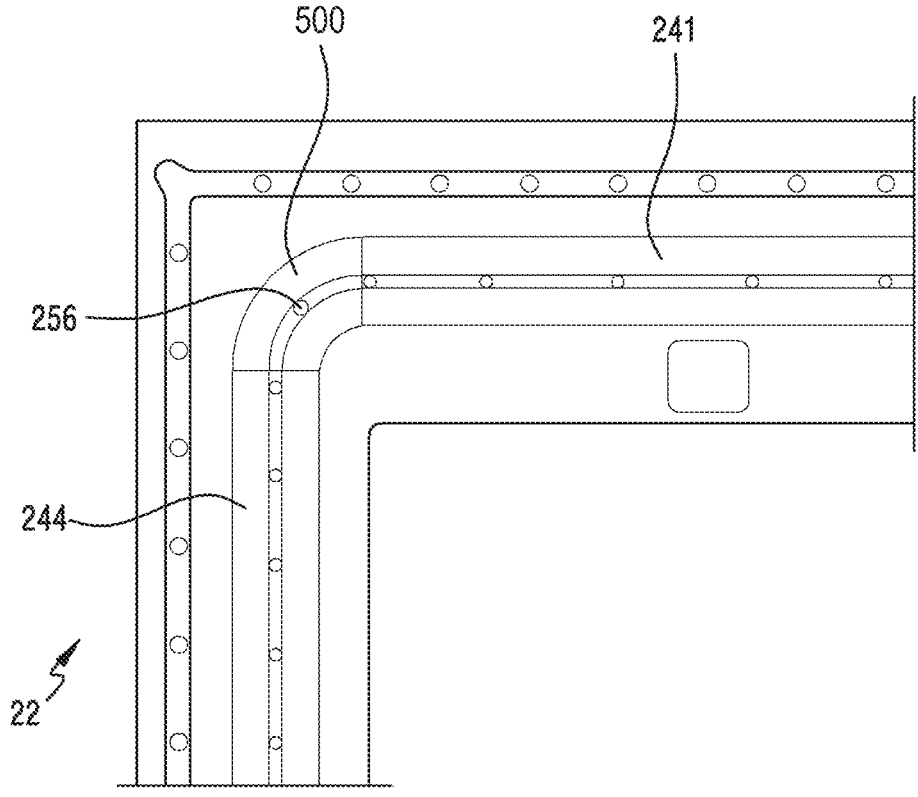
FIG. 5 is a plan view illustrating a corner V-groove formed at a corner of a V-groove structure according to an embodiment of the disclosure.

FIG. 5 is a plan view illustrating a corner V-groove formed at a corner of a V-groove structure according to an embodiment of the disclosure.

Referring to FIG. 5, according to various embodiments, corner V-grooves 500 may be formed at corners of a first to fourth V-grooves 241 to 244. According to an embodiment, a corner V-groove 500 may be formed at each corner of the first to fourth V-grooves 241 to 244. For example, the corner V-grooves 500 may be formed at a corner between the first and fourth V-grooves 241 and 244, a corner between the first and second V-grooves 241 and 242, a corner between the second and third V-grooves 242 and 243, and a corner between the third and fourth V-grooves 243 and 244, respectively. According to another embodiment, the first to fourth V-grooves 241 and 244 may be integrally and continuously connected to each other by the corner V-grooves 500. According to yet another embodiment, both ends of the corner V-groove 500 may be connected to the first and fourth V-grooves 241 and 244, respectively.

According to still another embodiment, the corner V-groove 500 may have a curved shape or a fan shape. According to various embodiments, the corner V-groove 500 may have a shape having a radius of curvature. According to other embodiments, the corner V-groove 500 may include at least one or more suction holes 256.

Figure 6:
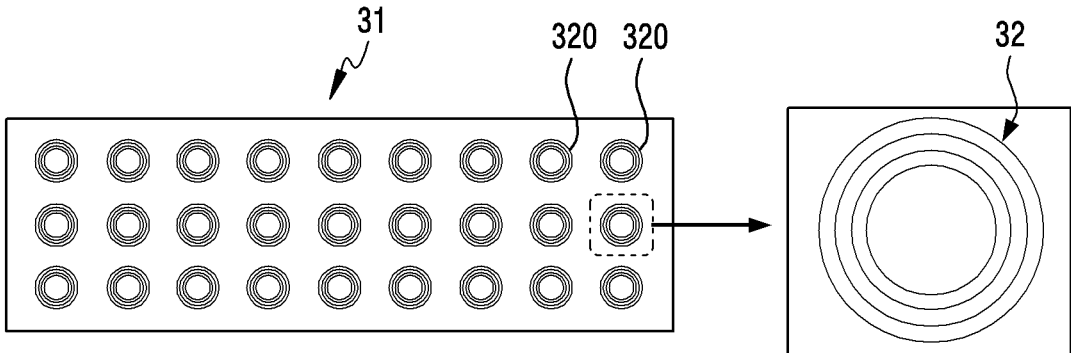
FIG. 6 is a plan view illustrating a plurality of suction vent units arranged in an upper main core according to an embodiment of the disclosure.
Figure 7:
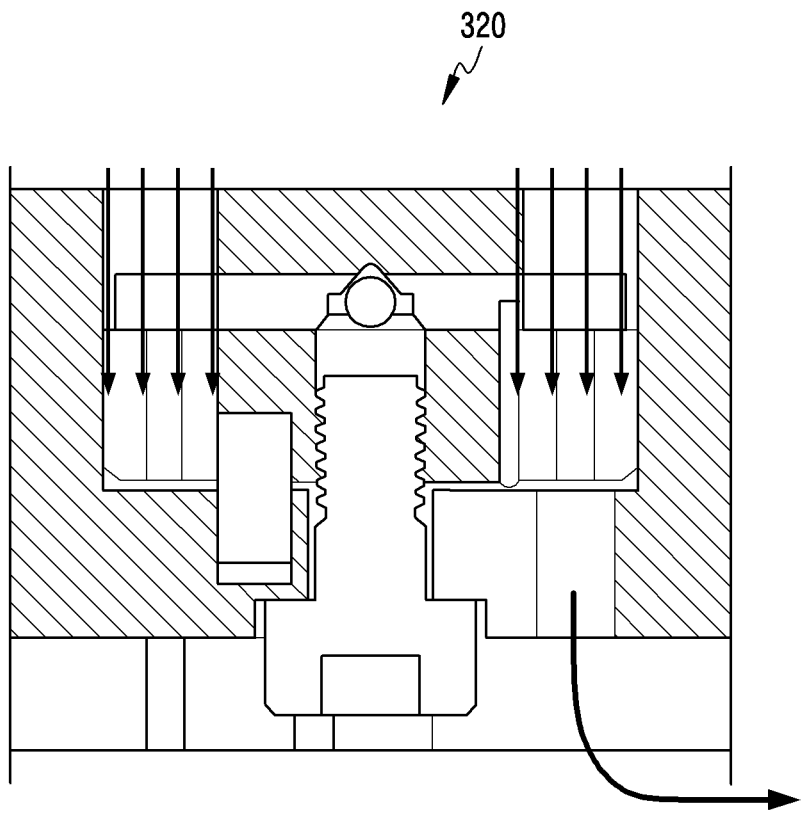
FIG. 7 is a cross-sectional view of a suction vent unit shown in FIG. 6 according to an embodiment of the disclosure.

FIG. 6 is a plan view illustrating a plurality of suction vent units arranged in an upper main core according to an embodiment of the disclosure. FIG. 7 is a cross-sectional view of a suction vent unit shown in FIG. 6 according to an embodiment of the disclosure.

Referring to FIGS. 6 and 7, according to various embodiments, a suction vent core 32 may include a plurality of suction vent cores (i.e., units) 26. In an embodiment, the suction vent core 26 may be spatially connected to an air suction hole (e.g., an air suction hole 310 shown in FIG. 1) and may suction a semiconductor chip substrate (e.g., the substrate(s) shown in FIG. 1) by a suction operation through the air suction hole. In another embodiment, a plurality of suction vent units 320 may be arranged at equal intervals on an upper main core 31. For example, the plurality of suction vent units 320 may be symmetrically disposed in the up, down, left, and right directions.

Figure 8:
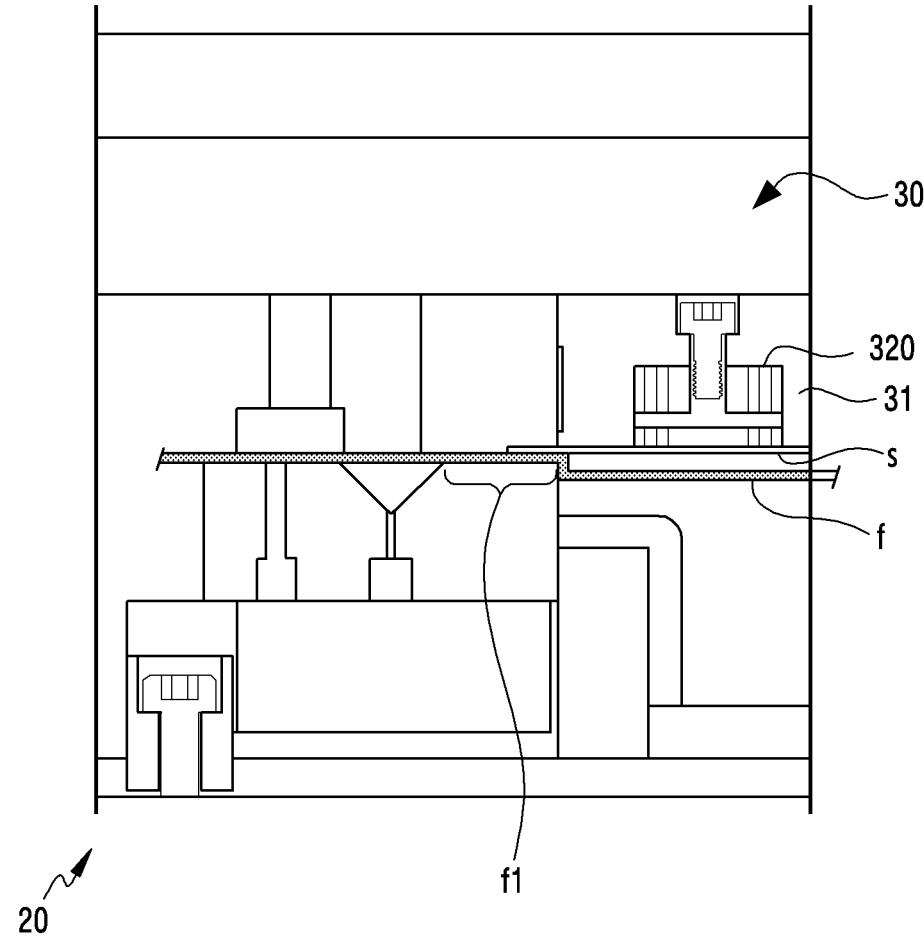
FIG. 8 is a cross-sectional side view illustrating a release film placed on a lower die according to an embodiment of the disclosure.

FIG. 8 is a cross-sectional side view illustrating a release film placed on a lower die according to an embodiment of the disclosure.

Referring to FIG. 8, according to various embodiments, a die device 10 may include a plurality of suction vent units 320 for suctioning a substrate(s) on which a plurality of semiconductors is arranged. According to an embodiment, in a conventional die device, a portion f1 of the release film f placed on a lower die 20 may be pressed (e.g., may be pressed by a clamp escape groove formed in an upper die 30) because a separate clamp device is used to fix the substrate(s) to the upper die 30, pressing of occurs, but in the embodiment, the pressing of the release film f may be prevented by removing the separate clamp device.

Figure 9:
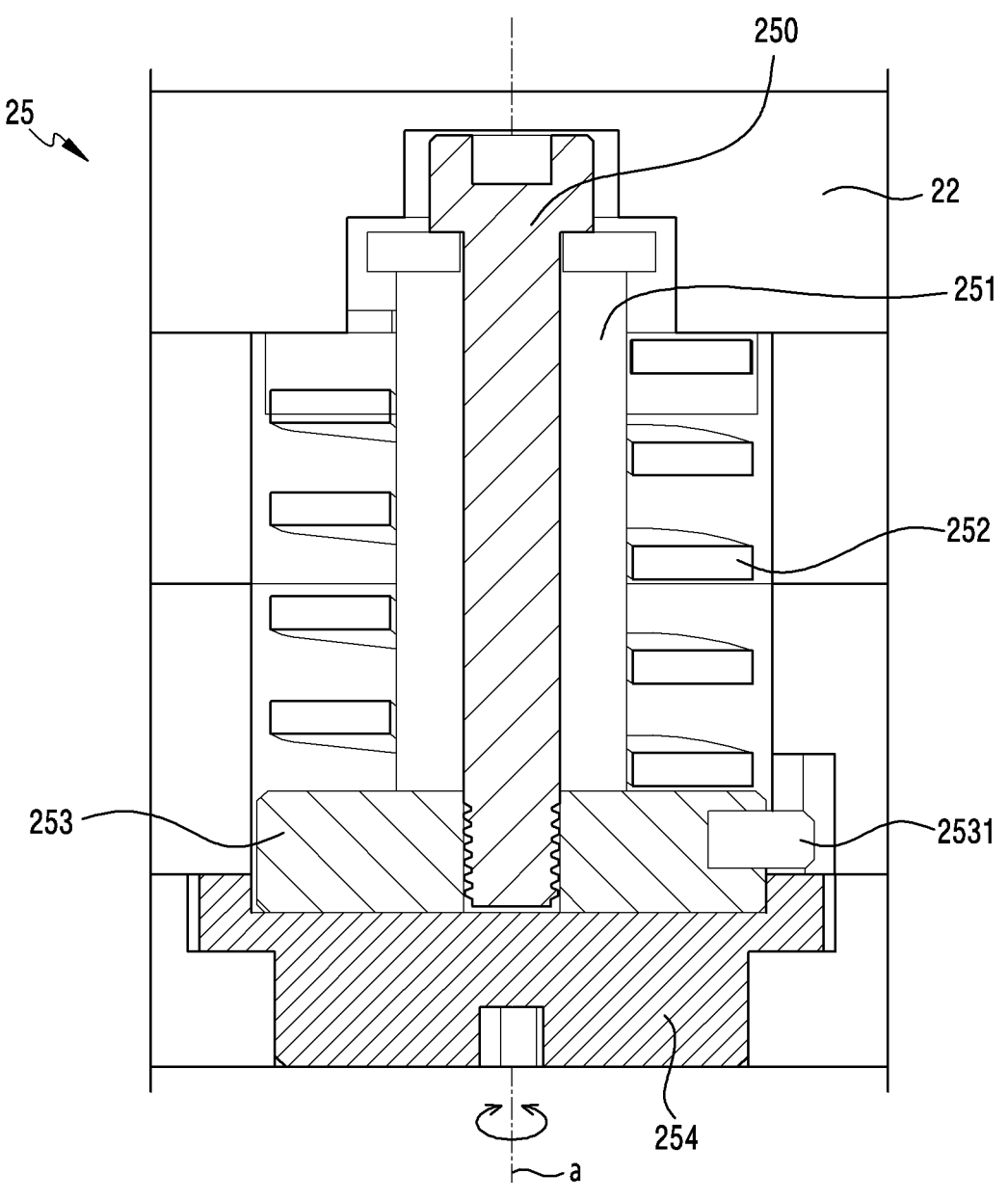
FIG. 9 is a cross-sectional view illustrating a device for adjusting tension of a spring according to an embodiment of the disclosure.
Figure 10:
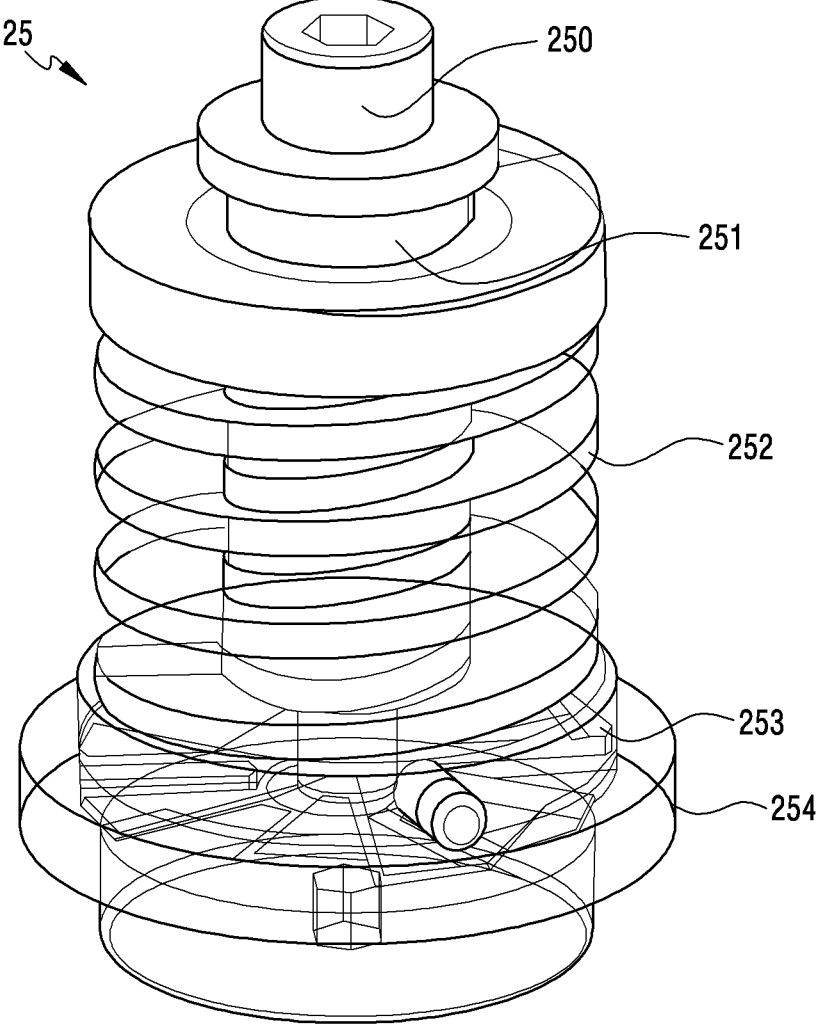
FIG. 10 is a perspective view illustrating a device for adjusting tension of a spring according to an embodiment of the disclosure.

FIG. 9 is a cross-sectional view illustrating a device for adjusting tension of a spring according to an embodiment of the disclosure. FIG. 10 is a perspective view illustrating a device for adjusting tension of a spring according to an embodiment of the disclosure.

Referring to FIGS. 9 and 10, a die device 10 according to various embodiments may include an adjustment device 25 for adjusting tension of a spring. According to one embodiment, the adjustment device 25 may be a manual device capable of adjusting the compression tension of a spring by rotating a rotation plate 254 around a rotation axis (a) at a predetermined angle without disassembling the mold.

According to another embodiment, the adjustment device 25 is a device capable of stepwise height adjustment using a stepped cam structure and may be disposed on the lower die 20. According to still another embodiment, the adjustment device 25 may include a central shaft 250, a hollow portion 251, a spring 252, a rotation plate 254, a lift plate 253, and a cam structure. According to yet another embodiment, the adjustment device 25 may have a lift plate 253 fixed to the lower end of the central shaft 250. For example, the lift plate 253 may be screwed to the lower end of the central shaft 250. In another example, the spring 252 may be disposed between a portion of the moving plate and the lift plate 253. In yet another example, the spring 252 may be a compression coil spring. One end of the spring 252 may be supported on a portion of the moving plate 22, and the other end may be supported on the lift plate 253. According to some embodiments, the lift plate 253 may move up or down according to whether or not the rotation plate 254 rotates, thereby adjusting the tension of the spring 252.

According to other embodiments, the rotation plate 254 of the adjustment device 25 may be disposed to face the lift plate 253. According to still other embodiments, the rotation plate 254 may rotate about the rotation axis (a) to adjust the tension possessed by the spring 252. A cam structure may, for example, be disposed between the lift plate 253 and the rotation plate 254 to adjust the tension of the spring 252.

Figure 11A:
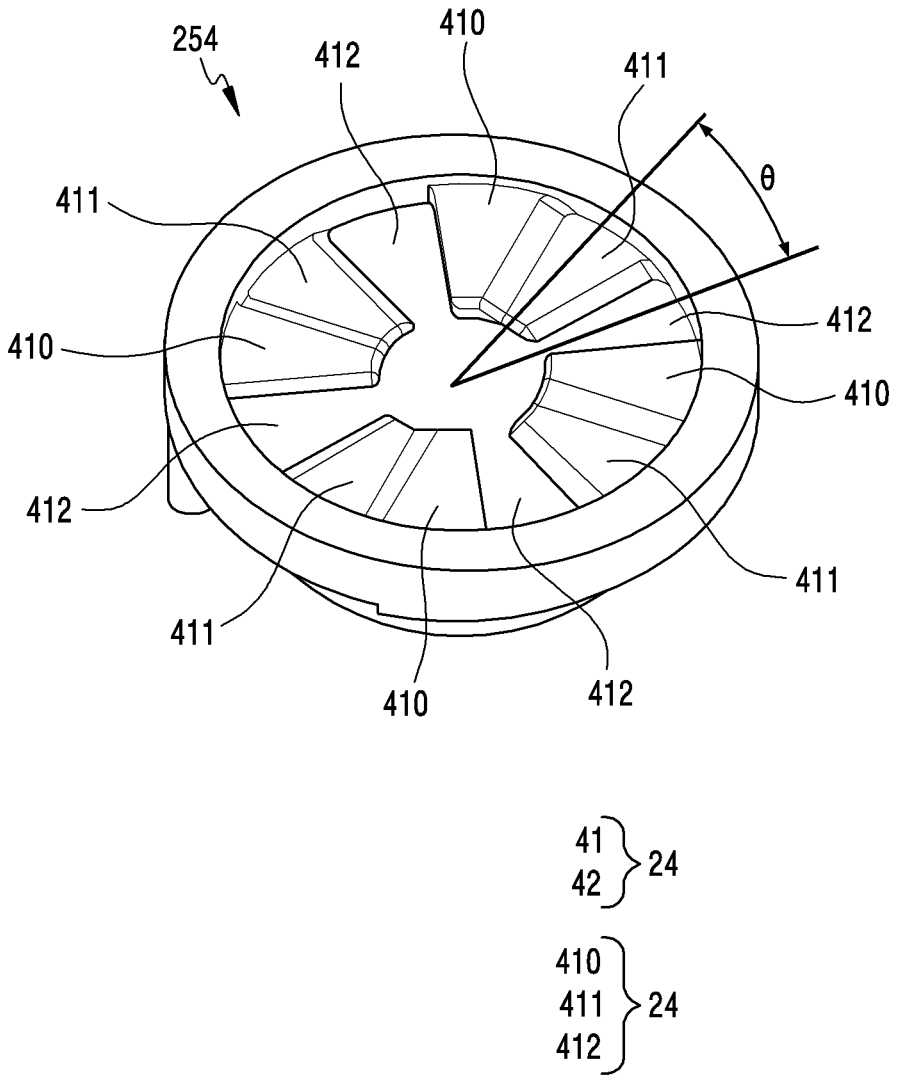
FIG. 11A is a perspective view illustrating a rotation plate according to an embodiment of the disclosure.
Figure 11B:
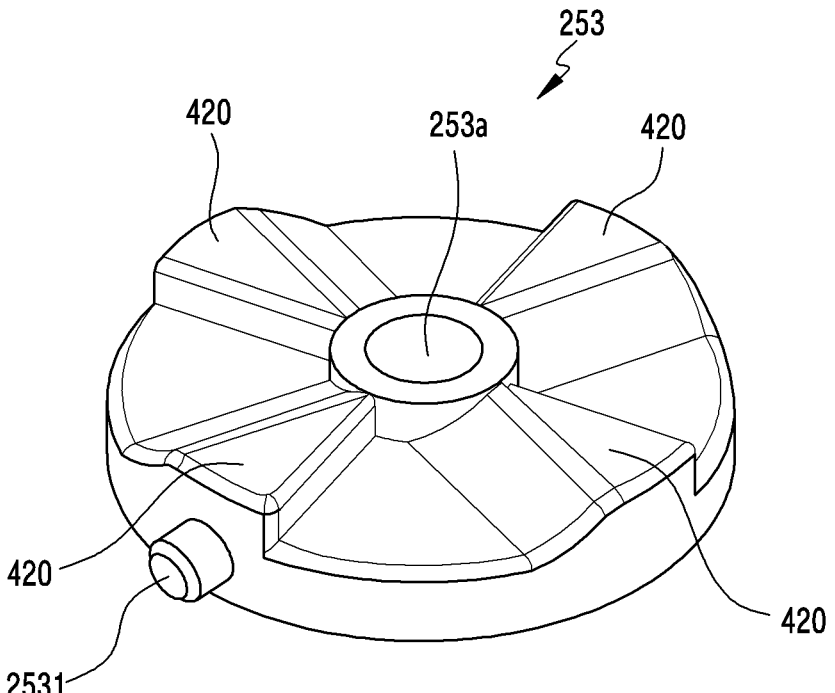
FIG. 11B is a perspective view illustrating a lift plate according to an embodiment of the disclosure.

FIG. 11A is a perspective view illustrating a rotation plate according to an embodiment of the disclosure. FIG. 11B is a perspective view illustrating a lift plate according to an embodiment of the disclosure.

Referring to FIGS. 11A and 11B, an adjustment device 25 according to various embodiments may have a cam structure 40 provided between a lift plate 253 and a rotation plate 254. According to various embodiments, the cam structure 40 may include a first cam structure 41 provided on an upper surface of the rotation plate 254 and a second cam structure 42 provided on a lower surface of the lift plate 253.

According to an embodiment, the cam structure 40 may be configured such that the first and second cam structures 41 and 42 engage with each other, resulting in a cam operation depending on whether or not the rotation plate 254 rotates. According to another embodiment, the first cam structure 41 may include a plurality of first cams 410 to 412. According to yet another embodiment, the respective first cams 410 to 412 may be arranged at equal intervals along the circumferential direction based on the center thereof.

According to still another embodiment, the respective first cams 410 to 412 may be formed at an interval of 30 degrees from each other based on the center, and each of the first cams may include a first cam 412 having a first thickness (e.g., 2,2t), a first cam 411 having a second thickness (e.g., 2.8t), and a first cam 412 having a third thickness (e.g., 3.6t). In an example, the first cams 410 to 412 having first to third thicknesses may constitute one first cam set 413.

According to some embodiments, the rotation plate 254 may include four first cams 412 of 2.2t, four first cams 411 of 2.8t, and four first cams 410 of 3.6t. For example, the three first cams 410 to 412 may be stepped.

According to other embodiments, the second cam structure 42 formed on the lift plate 253 may include a plurality of first cams 420. According to still other embodiments, the respective first cams 420 may be arranged at equal intervals along the circumferential direction based on the center thereof. For example, the second cams 420 may include four first cams 420 spaced at equal intervals in the circumferential direction based on the center.

In an embodiment, if the rotation plate 254 rotates step by step at a predetermined angle while the first and second cam structures 41 and 42 are engaged, the lift plate 253 may move up and down within a limited distance. The vertical movement of the lift plate 253 may, for example, make it possible to adjust the tension of the spring.

In another embodiment, the lift plate 253 may include a rotation prevention pin 2531. In yet another embodiment, the rotation prevention pin 2531 has a protrusion shape protruding outwards, and may prevent a rotational operation caused by rotation of the rotation plate 254 and enable only a lifting operation. Reference numeral 253a may be an opening through which the central shaft passes.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A die device for molding a plurality of semiconductor chips, the die device comprising:

a lower die comprising a moving plate that has a plurality of V-groove structures configured to suction a release film coated with resin; and an upper die configured to descend to the lower die or ascend from the lower die so as to close/open the dies, wherein the upper die comprises at least a plurality of suction vent units configured to suction a substrate on which the semiconductor chips are arranged, wherein the lower die comprises an adjustment device configured to manually adjust tension of a spring supporting the moving plate, wherein the adjustment device comprises:

a central shaft, and a non-rotating lift plate engaged with a rotation plate, disposed between the rotation plate and the spring, wherein the rotation plate is configured to be manually rotatable around the central shaft and further configured to actuate the non-rotating lift plate to cause the non-rotating lift plate to ascend or descend along the central shaft by rotation of the rotation plate around the central shaft, and wherein the tension of the spring is adjusted as the non-rotating lift plate ascends or descends.

2. The die device of claim 1, wherein the suction vent units are arranged at equal intervals on an upper main core of the upper die.

3. The die device of claim 1, wherein the adjustment device further comprises:

a hollow portion to which the central shaft is inserted, wherein the lift plate is disposed at a lower end of the hollow portion, and wherein the spring is disposed between an upper end of the hollow portion and the lift plate; and a cam structure disposed between the lift plate and the rotation plate and configured to move the lift plate up and down around the central shaft according to rotation of the rotation plate.

4. The die device of claim 3, wherein the cam structure comprises:

a first cam structure formed on an upper surface of the rotation plate; and a second cam structure formed on a lower surface of the lift plate and configured to perform a cam motion with the first cam structure.

5. The die device of claim 4, wherein the first cam structure has a roughly stepped cross-section and comprises a plurality of first cams formed at equal intervals in a circumferential direction based on a center of the rotation plate.

6. The die device of claim 5, wherein the plurality of first cams comprise:

a first cam set comprised of a first cam having a first thickness, a second cam having a second thickness less than the first thickness, and a third cam having a thickness less than the second thickness, and wherein a plurality of first cam sets is arranged at equal intervals in a circumferential direction on the rotation plate.

7. The die device of claim 6, wherein the second cam structure comprises a plurality of second cams formed at equal intervals based on the circumferential direction on the lower surface of the lift plate, and wherein each of the second cams protrudes toward the first cam structure.

8. The die device of claim 1, wherein the V-groove structure comprises first to fourth V-grooves respectively formed along first to fourth edges of the moving plate, and wherein a supplementary V-groove is further formed at a corner between the first to fourth V-grooves.

9. The die device of claim 8, wherein the supplementary V-groove extends across an area between the first and fourth V-grooves.

10. The die device of claim 8, wherein the supplementary V-groove comprises at least one suction hole.

11. The die device of claim 9, wherein the supplementary V-groove is straight.

12. The die device of claim 8, wherein corner V-grooves are respectively formed in corners between the first to fourth V-grooves, so that the first to fourth V-grooves are integrally connected to each other.

13. The die device of claim 12, wherein the corner V-groove comprises at least one or more second suction holes.

14. The die device of claim 8, wherein a suction vent portion is formed along a periphery of the first to fourth V-grooves, wherein the suction vent portion comprises a supplementary suction portion protruding from the corner, and wherein the supplementary suction portion comprises at least one or more supplementary suction holes.

15. The die device of claim 1, wherein first to fourth center guide blocks are respectively disposed along a first to fourth edges of the moving plate in order to maintain a center of a moving upper die.

* * * * *